United States Patent [19]

Hietala

[11] Patent Number: 5,055,803
[45] Date of Patent: Oct. 8, 1991

[54] PARAMETER TOLERANT PLL SYNTHESIZER

[75] Inventor: Alexander W. Hietala, Cary, Ill.

[73] Assignee: Motorola, Inc., Schaumburg, Ill.

[21] Appl. No.: 628,533

[22] Filed: Dec. 14, 1990

[51] Int. Cl.$^5$ .............................................. H03L 7/093
[52] U.S. Cl. .................................... 331/17; 331/1 A; 331/16; 331/25
[58] Field of Search ................. 331/1 A, 16, 17, 18, 331/25; 375/97; 455/260

[56] References Cited

U.S. PATENT DOCUMENTS

| | | | |
|---|---|---|---|
| 4,516,083 | 5/1985 | Turney | 331/1 A |
| 4,546,329 | 10/1985 | Unger | 331/16 |
| 4,559,505 | 12/1985 | Suaréz et al. | 331/1 A |
| 4,952,889 | 8/1990 | Irwin et al. | 332/128 |

OTHER PUBLICATIONS

Graham et al., "The Synthesis of 'Optimum' Transient Response: Criteria and Standard Forms", AIEE Transactions, Nov. 1953, pp. 273-288.

Underhill et al., "The Effect of the Sampling Action of Phase Comparators on Frequency Synthesizer Performance", Proceedings of the 33rd Annual Frequency Symposium, 1979, pp. 449-457.

Przedpelski, "PLL Primer - Part IV", RF Design, Nov. 1987, pp. 88, 90, 93, 94, 96.

*Primary Examiner*—David Mis
*Attorney, Agent, or Firm*—Raymond A. Jenski; Rolland R. Hackbart

[57] ABSTRACT

In a PLL synthesizer, the tolerance to gain and component variations is greatly reduced when the gain of the loop in increased above that which the loop was initially designed for and if the third order loop symmetric ratio is reduced to a value within the range of 2.0 to 2.5. Higher order loops based on the third order symmetric ratio range have correspondingly lower transmission pole frequency to open unity gain frequency ratios.

16 Claims, 3 Drawing Sheets

PARAMETER TOLERANT PLL SYNTHESIZER

BACKGROUND OF THE INVENTION

This invention relates to frequency synthesizers and more particularly to a phase locked loop (PLL) frequency synthesizer having a multiple order loop filter with a parameter tolerant placement of symmetric ratio.

PLL synthesizers are widely used in various communications systems to provide accurate frequency control of signal oscillators. This control is not perfect in that a finite time is required to synthesize a frequency to a given accuracy limit. In addition, a trade-off exists between the speed of phase lock acquisition and spurious noise performance of the synthesizer.

In previous communications systems, the phase lock time was less demanding than presently required in the new digital cellular systems. Digital radio systems must be locked to within a specified frequency within a critical time interval or the data conveyed by the system will be un-recoverable. In addition, subscriber units, which move about the radio coverage areas of the system, are continually checking the channels available in a coverage adjacent to the coverage area providing communication service and are frequency hopping in the service-providing coverage area. Therefore, the frequency locking process occurs continually during the time a communication channel is in use between the subscriber unit and a fixed station in the service providing coverage area. Therefore, the lock time must be maintained below stringent limits.

Current PLL synthesizer designs use third order PLLs in which there is one "mobile" pole and one "mobile" zero in the transfer function of the open loop response. The pole frequency and zero frequency are selected to be geometrically symmetric about the open loop unity gain frequency. The ratio of the open loop unity gain frequency to the zero frequency is therefore called the symmetric ratio.

A third order PLL is shown in FIG. 1 and has an equation for the open loop conventionally written as follows:

$$\frac{K_v K_\phi \left(1 + j\frac{\omega}{\omega_z}\right)}{s^2 N(C_1 + C_2)\left(1 + j\frac{\omega}{\omega_p}\right)}$$

where:

$$\omega_z = \frac{1}{R_1 C_1},$$

N = frequency division ratio of divider 111 and $$\omega_p = \frac{1}{R_1 \frac{C_1 C_2}{C_1 + C_2}}$$

Plots of the gain and phase of this expression are presented in FIG. 2. These plots are used to analyze system stability such that when the gain crosses 0 db the phase will not be less than −180°. This is a familiar condition for stability. The degree of stability is measured by the difference in phase from −180° at the frequency where the gain is unity. This frequency is called $w_o$ and is the open loop unity gain frequency. The phase in excess of −180° at this point is known as the phase margin.

At low frequencies there are two inherent poles, one from the VCO 103 frequency-to-phase conversion, and one from the current sources 105 and 107 at the output of the phase detector 109 driving a capacitor ($C_2$) input filter. As shown in FIG. 2, this configuration results in a frequency response curve slope of −12 db/octave. When the frequency crosses $w_z$ then the slope breaks to one net pole or −6 db/octave. Finally when the frequency crosses $w_p$ then the slope breaks again to two net poles or −12 db/octave and continues in this fashion as the frequency increases.

The phase response corresponding to this frequency response begins at −180° at DC (0 Hz). As the zero is encountered, the phase increases and asymptotically approaches −90°. Finally when the pole is encountered the phase decreases back to an asymptote of −180°. Since the phase of the open loop never crosses −180° this system is stable. Once the system stability has been established, the placement of the pole and zero may be selected such that the lock time is minimized for a given PLL bandwidth. It is more convenient to consider the open loop unity gain frequency instead of the closed loop PLL bandwidth. These frequencies will be nearly the same in practice.

A mathematical derivation is presented hereinafter which shows that the best possible lock time is achieved when the following condition is satisfied:

$$\frac{\omega_o}{\omega_z} = \frac{\omega_p}{\omega_o} = X \approx 2.75$$

This condition is known as symmetric pole placement about the open loop unity gain frequency. "X" is known as the symmetric ratio. The graph presented in FIG. 4 shows an example of lock time versus symmetric ratio for a fixed $w_o$.

The derivation first assumes a symmetric pole-zero placement, then shows that this is the optimum condition with a symmetric ratio "X" of three, and then modifies this symmetric ratio slightly due to the damped sinusoidal nature of the locking waveform.

The open loop equation is:

$$KG(s) = \frac{K_\phi K_v \left(1 + \frac{s}{s_z}\right)}{s^2 N(C_1 + C_2)\left(1 + \frac{s}{s_p}\right)}$$

At the open loop unity gain frequency the magnitude of KG(s) must be one.

$$1 = \frac{K_\phi K_v \left(1 + \left(\frac{\omega_o}{\omega_z}\right)^2\right)^{\frac{1}{2}}}{\omega_o^2 N(C_1 + C_2)\left(1 + \left(\frac{\omega_o}{\omega_p}\right)^2\right)^{\frac{1}{2}}}$$

Where X is the symmetric ratio, $w_o/w_z = w_p/w_o = X$, therefore:

$$1 = \frac{K_\phi K_v (1 + X^2)^{\frac{1}{2}}}{\omega_o^2 N(C_1 + C_2)\left(1 + \frac{1}{X}^2\right)^{\frac{1}{2}}}$$

Factoring $X^2$ out of the top radical then:

$$1 = \frac{K_\phi K_v \left\{X^2\left(1 + \frac{1}{X}^2\right)\right\}^{\frac{1}{2}}}{\omega_o^2 N(C_1 + C_2)\left(1 + \frac{1}{X}^2\right)^{\frac{1}{2}}}$$

Solving for $w_o$:

$$\omega_o^2 = \frac{K_v K_\phi X}{N(C_1 + C_2)} \text{ and } \omega_o^3 = \frac{K_v K_\phi s_p}{N(C_1 + C_2)} \text{ since } \omega_o = \frac{s_p}{X}$$

The function of interest is the frequency error of the loop. From conventional control theory this can be found as follows:

$$E(s) = \frac{A(s)}{1 + KG(s)} = \frac{\left(1 + \frac{s}{s_p}\right)s^2}{\left(1 + \frac{s}{s_p}\right)s^2 + \frac{K_v K_\phi \left(1 + \frac{s}{s_z}\right)}{N(C_1 + C_2)}} A(s)$$

where $A(s)$ is the input function.

$$\frac{E(s)}{A(s)} = \frac{\frac{s^3}{s_p} + s^2}{\frac{s^3}{s_p} + s^2 + \frac{K_v K_\phi s}{N(C_1 + C_2)s_z} + \frac{K_v K_\phi}{N(C_1 + C_2)}}$$

$$\frac{E(s)}{A(s)} = \frac{s^3 + s^2 s_p}{s^3 + s^2 s_p + \frac{K_v K_\phi s_p}{N(C_1 + C_2)s_z} s + \frac{K_v K_\phi s_p}{N(C_1 + C_2)}}$$

Substituting in the expressions derived above for $w_o$:

$$\frac{E(s)}{A(s)} = \frac{s^3 + X\omega_o s^2}{s^3 + X\omega_o s^2 + X\omega_o^2 s + \omega_o^3}$$

Dividing numerator and denominator by $w_o$ and letting $$\bar{s} = \frac{s}{\omega_o},$$

$$\frac{E(\bar{s})}{A(s)} = \frac{\left(\frac{s}{\omega_o}\right)^3 + X\left(\frac{s}{\omega_o}\right)^2}{\left(\frac{s}{\omega_o}\right)^3 + X\left(\frac{s}{\omega_o}\right)^2 + X\left(\frac{s}{\omega_o}\right) + 1} =$$

$$\frac{\bar{s}^3 + X\bar{s}^2}{\bar{s}^3 + X\bar{s}^2 + X\bar{s} + 1}$$

In general the inverse Laplace transform of the above equation results in three separate poles which will each exponentially decay with time. The fastest possible decay will occur if all three poles are at one frequency. (The lock time is dominated by the lowest frequency pole so if all are equal, no one pole dominates the response).

If X=3 then $$\frac{E(\bar{s})}{A(\bar{s})} = \frac{\bar{s}^3 + X\bar{s}^2}{(\bar{s} + 1)^3}$$

Thus, if a symmetric pole zero placement is chosen with X=3, it appears that the fastest possible lock time, given the loop bandwidth, will be obtained. But because the locking waveform is a damped sinusoid and X=3 represents the fastest locking envelope, it is possible to adjust the symmetric ratio slightly from that above and improve the lock time. The graph of the frequency error over time of FIG. 3 shows the situation.

From FIG. 3, it can be seen that the definition of initial frequency to what is an acceptable final error will determine what value of X is optimum, i.e., a different interpretation of "locked" may or may not catch the next peak of the damped sinusoid.

By simulating various symmetric ratios, it can be shown that X=3 or greater is an "overdamped" type of response. If the symmetric ratio is lower, then the loop rings such as an underdamped second order loop will ring. Use of this ringing allows the lock time to decrease even though the envelope of the lock time is greater.

When the excitation to the loop is a unit step in frequency, the lock time will be defined such that final lock corresponds to $4 \times 10^{-7}$ times the initial step.

$$A(\bar{s}) = \frac{1}{\bar{s}} \text{ thus } E(\bar{s}) = \frac{\bar{s}(\bar{s} + X)}{(\bar{s} + 1)(\bar{s}^2 + (X - 1)\bar{s} + 1)}$$

Breaking into partial fractions:

$$E(\bar{s}) = \frac{1 - X}{3 - X} \cdot \frac{1}{(\bar{s} + 1)} + \frac{2}{3 - X} \cdot \frac{\bar{s} + \frac{X - 1}{2}}{(\bar{s}^2 + (X - 1)\bar{s} - 1)}$$

A standard form to obtain the inverse Laplace transform may be set up:

$$E(\bar{s}) = \frac{1 - X}{3 - X} \cdot \frac{1}{(\bar{s} + 1)} +$$

$$\frac{2}{3 - X} \cdot \frac{\bar{s} - \frac{1 - X}{2}}{\left[\bar{s} - \left(\frac{1 - X}{2}\right)\right]^2 + \left(\sqrt{\frac{(3 - X)(1 + X)}{4}}\right)^2}$$

Solving for the inverse transform from a table of standard forms yields:

$$e(\tau) = \frac{1 - X}{3 - X} e^{-\tau} +$$

$$\frac{2}{3 - X} e^{\frac{1-x}{2}\tau} \cos\left(\sqrt{\frac{(3 - X)(1 + X)}{4}} \tau\right)$$

where $\tau = \omega_o t$.

Thus, the fastest lock time to $4 \times 10^{-7}$ of the initial step occurs for X=2.625. Other systems have required that a locked condition corresponded to 0.0001 times the initial step and in that case the fastest lock occurred for $X = 2.778$. These derivations are valid for a continuous time model. If the loop bandwidth is more than 1% of the sampling frequency then a first order sampling corrected model should be used to find the best point.

Thus, it appears from the lock time versus symmetric ratio graph of FIG. 4 that the optimum symmetric ratio is $X = 2.7$ for a third order loop. Present PLLs typically do indeed have the third order loop symmetric ratio selected in accordance with this criterion. This selection results in the fastest possible loop given the PLL bandwidth. However, since the components used to realize actual phase locked loops are subject to environmental extremes and normal part tolerance variation, the fastest loop selection is subject to variations in lock time which may result in undesired results.

SUMMARY OF THE INVENTION

The present invention encompasses a phase locked loop synthesizer which has an open loop unity gain frequency and tolerance to component parameter variation. A generator generates an output signal which is used to produce a first signal related to a difference between the output signal and a predetermined reference signal. The first signal is modified to produce a second signal which is coupled to the generator. The modification includes at least one filter transmission pole having a first break frequency related to the unity gain frequency by a first magnitude. The modification also includes at least one transmission zero having a second break frequency related to the unity gain frequency by a second magnitude. Both said first magnitude and said second magnitude have a numeric value of less than 2.5.

DESCRIPTION OF A PREFERRED EMBODIMENT

The fastest possible third order loop employing a symmetric ratio of 2.7 would indeed be the best operation point if the loop components and gain were capable of tight control. In practice, the control input gain of VCO 103 can vary typically 2 to 1 and the phase detector gain 109 can vary typically 2 to 1, for a total gain variation of 4 to 1. The lock time of the phase locked loop (PLL) can be observed to change as the gain is varied for a variety of symmetric ratios and is shown in FIG. 5.

Figure 1:
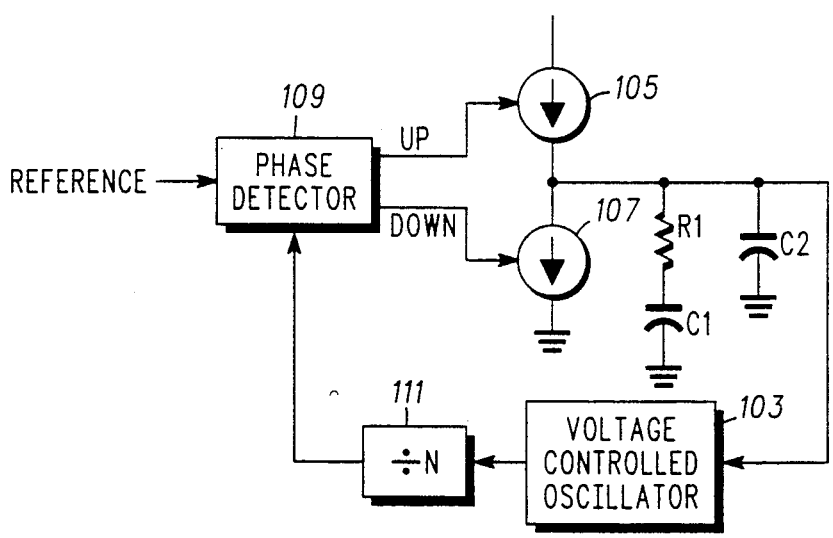
FIG. 1 is a block diagram of a phase locked loop synthesizer.
Figure 2:
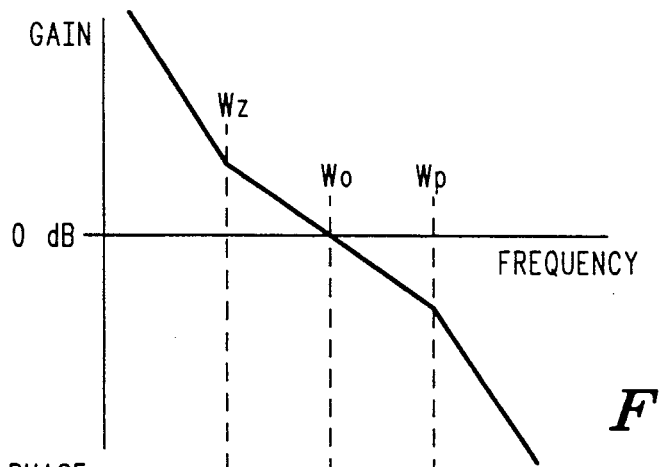
FIG. 2 is gain versus frequency and a phase versus frequency graph of the loop response of the synthesizer of FIG. 1.
Figure 3:
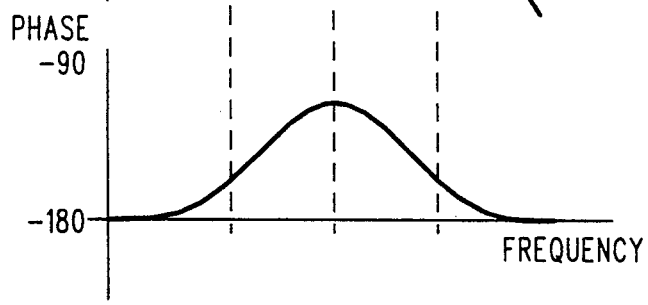
FIG. 3 is a frequency error versus time graph of a phase locked loop synthesizer illustrating lock time.
Figure 4:
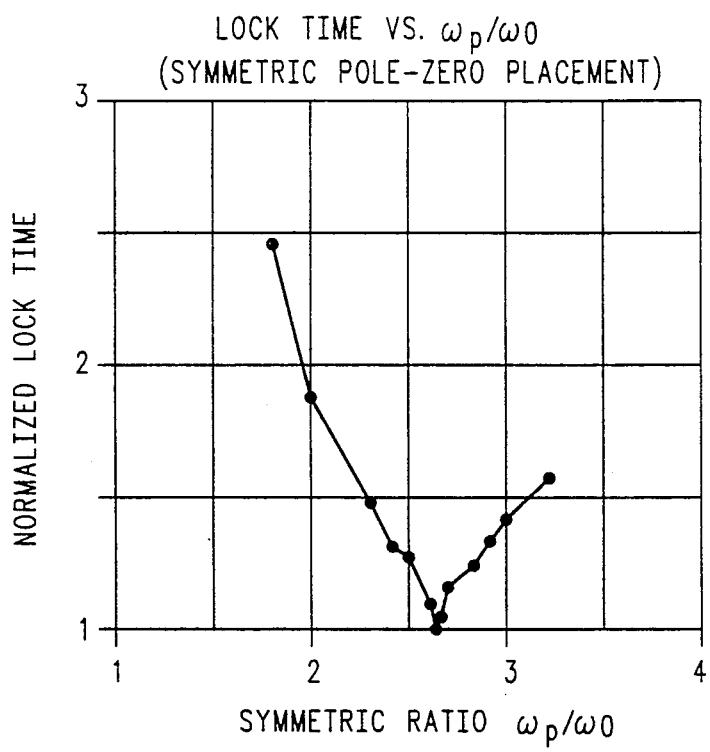
FIG. 4 is a graph of lock time versus symmetric ratio of a conventional phase locked loop synthesizer.
Figure 5:
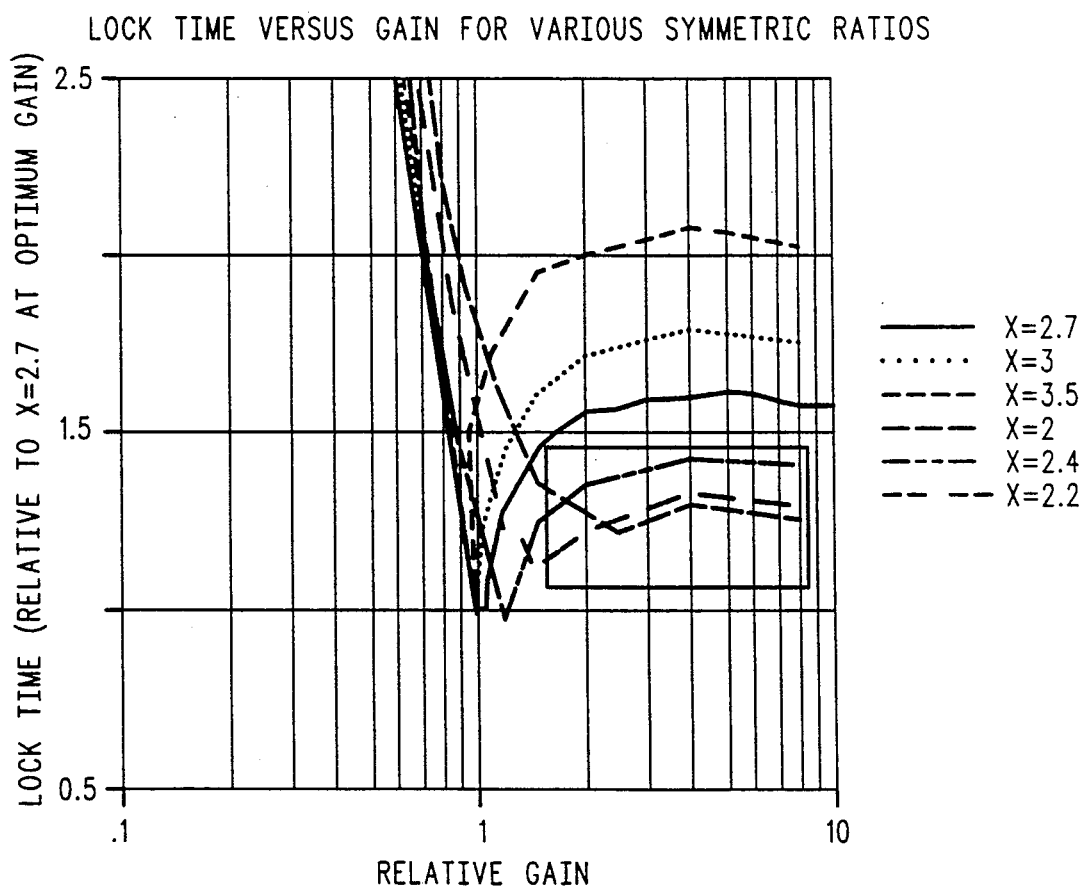
FIG. 5 is a graph of lock time versus loop relative gain for varying values of symmetric ratios.

From FIG. 5 (which is generated from computer simulations of lock time versus gain) it can be seen that if the "optimum" point is chosen in the conventional way, lock time suffers a precipitous degradation as the gain decreases. On the other hand, the gain can increase without a dramatic effect on lock time. Thus the first correction to optimum placement of the symmetric ratio is to design the PLL as though there were only one-half the actual gain. This moves the operating point to a relative gain of 2, which allows a 50% gain reduction without ill effects on lock time. The increased gain degrades spurious signal rejection by 6 db but this is a small degradation and well worth the engineering tradeoff.

A second correction to the optimum design is realized by noting that at higher gains $X = 2.7$ is not the best operating point. It is an important feature of the present invention that a symmetric ratio of about 2.3 results in a lower lock time at a relative gain of 2 and a much flatter curve about the minimum.

Thus, a third order PLL can be designed for nearly the best possible lock time and high tolerance to variations in loop parameters if the pole and zero are symmetrically placed about the open loop unity gain frequency with a ratio of 2.3. Furthermore the loop should be designed so that the actual gain is twice the gain for which the loop filter is designed.

For the third order PLL the open loop gain and phase are derived as follows:

$$T_{loop}^{open}(s) = \frac{K_v K_\phi \left(1 + j\frac{\omega_0}{\omega_z}\right)}{s^2 N(C_1 + C_2)\left(1 + j\frac{\omega_0}{\omega_p}\right)}$$

$$\phi_3(\omega_o) = \tan^{-1}\left(\frac{\omega_o}{\omega_z}\right) - \tan^{-1}\left(\frac{\omega_o}{\omega_p}\right) - 180°$$

These concepts may be extended to higher order phase locked loops. The goal is to equate the phase response of the higher order system to that of the third order system at the open loop unity gain frequency. This will result in a phase locked loop with a similar time domain response to the third order system but with added attenuation to high frequency noise components. The design of a higher order loop may begin with the analysis of a third order loop and, in accordance with the present invention, employ a zero frequency and a pole frequency having a symmetric ratio of less than 2.5. A fourth order loop is formed by equating the phases at the open loop unity gain frequency thereby causing the pole frequency to increase. Further more, a fifth order loop having equal phases at the open loop unity gain frequency has a pole frequency to increase in frequency over the fourth order.

If the fourth order loop were designed in accordance with conventional teachings and a third order design with a symmetric ratio of 2.7, the fourth order pole frequency to open loop unity gain frequency ratio would be 5.58. However, a fourth order loop in accordance with the present invention has a fourth order pole frequency to open lop unity gain frequency ratio of 5.19 or less. The zero frequency to open loop unity gain frequency ratio for the conventional fourth order loop remains at 2.7 while the zero frequency to open loop unity gain frequency for the fourth order loop of the present invention is at 2.5 or less.

In a similar fashion, a fifth order loop designed in accordance with conventional teachings and a third order symmetric ratio of 2.7 has a fifth order pole frequency to open loop unit gain frequency ration of 8.42 and a zero to open loop unity gain frequency ratio of 2.7. A fifth order loop in accordance with the present invention has a fifth order pole frequency to open loop unity gain frequency ratio of 7.84 or less and a zero frequency to open loop unity gain frequency ratio of 2.5 or less based on a third order loop symmetric ratio of 2.5 or less (shown in FIG. 7). Table 1 illustrates the pole frequency ratio locations for fourth and fifth order loops relative to the third order symmetric ratio values.

TABLE 1

| Symmetric Ratio | $W_{p4}/W_0$ | $W_{p5}/W_0$ |
|---|---|---|
| 2.0 | 4.24 | 6.42 |
| 2.1 | 4.43 | 6.70 |
| 2.2 | 4.62 | 6.98 |
| 2.3 | 4.81 | 7.27 |
| 2.4 | 5.00 | 7.56 |
| 2.5 | 5.19 | 7.84 |
| 2.6 | 5.39 | 8.13 |
| 2.7 | 5.58 | 8.42 |
| 2.8 | 5.77 | 8.71 |
| 2.9 | 5.97 | 9.00 |
| 3.0 | 6.16 | 9.29 |

Figure 6:
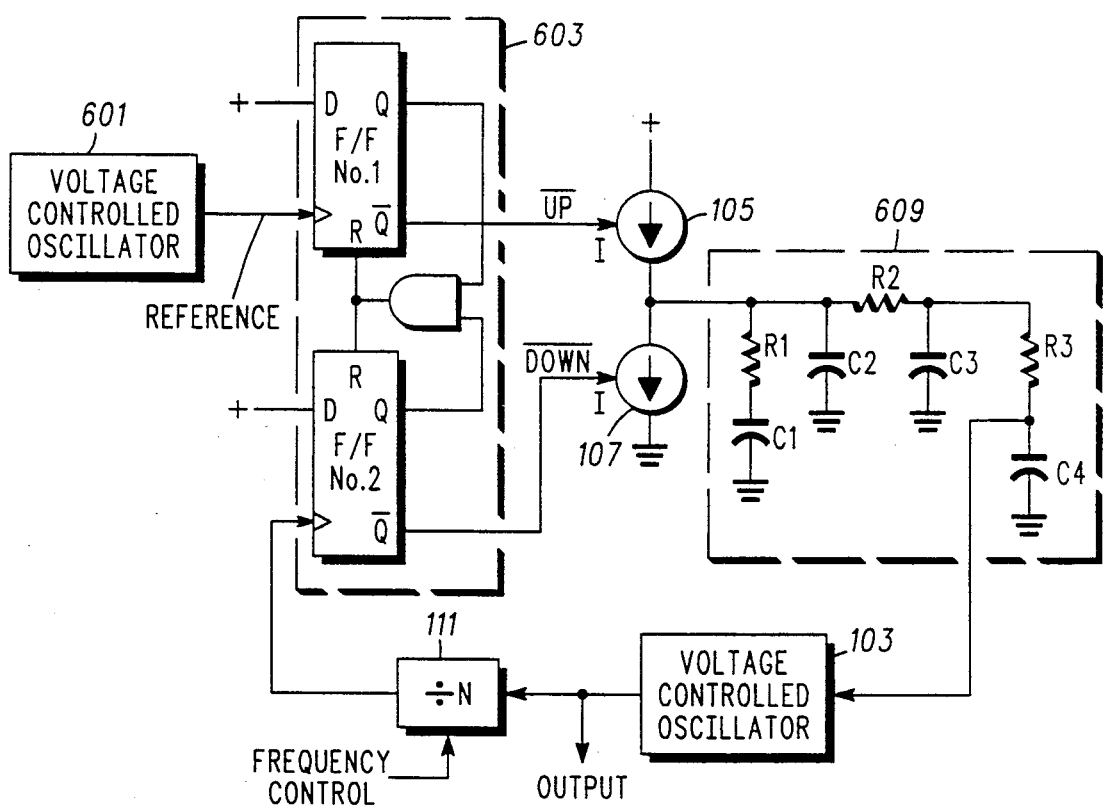
FIG. 6 is a block diagram of a phase locked loop synthesizer which may employ the present invention.

In the preferred embodiment of a fifth order PLL, useful in a digital cellular radiotelephone, a block diagram like that shown in FIG. 6 is employed. While a passive loop filter is shown, an active loop filter obeying the teachings of the present invention may be employed. A reference oscillator 601 supplies a frequency stable signal to a phase detector 603, which in the preferred embodiment is a conventional tristate phase detector having a $K_{100}=1/2\pi$. Up and down correction pulses are applied to an up current source 105 and a down current source 107 respectively. The loop filter 609 provides a fifth order response with the configuration shown. The filtered control signal is applied to the VCO 103 to alter and control the frequency of oscillation. The output from the VCO 103 is output to other radio circuits (not shown) and to a conventional controlled frequency divider 111 for frequency reduction before being coupled to the phase detector 603. The phase locked loop is thus constructed employing the third order symmetric ratio of $X=2.3$ and established in accordance with the present invention as follows:

$$T_{loop}^{open}(s) = \frac{K_v K_\phi \left(1 + j\frac{\omega 0}{\omega_z}\right)}{s^2 N(C_1 + C_2)\left(1 + j\frac{\omega 0}{\omega_{p4}}\right)^3}$$

$$\phi_5(\omega_o) = \tan^{-1}\left(\frac{\omega_o}{\omega_z}\right) - 3\tan^{-1}\left(\frac{\omega_o}{\omega_{p4}}\right) - 180°$$

By equating the phase of the third order loop and the fifth order loop at $\omega_o$ the following expression is obtained for the pole locations.

$$\frac{\omega_{p5}}{\omega_o} = \frac{1}{\tan\left(\frac{1}{3}\tan^{-1}\left(\frac{1}{X}\right)\right)} \quad \frac{\omega_o}{\omega_z} = X$$

An optional pole skewing factor "k" is introduced for the fifth order PLL by multiplying one pole by $(1-k)$, a second pole by $(1-k)$, and the third pole is unchanged. This results in the following pole-zero placement.

$$\frac{\omega_{p5.1}}{\omega_o} = \frac{1 - k}{\tan\left(\frac{1}{3}\tan^{-1}\left(\frac{1}{X}\right)\right)}$$

$$\frac{\omega_{p5.2}}{\omega_o} = \frac{1 + k}{\tan\left(\frac{1}{3}\tan^{-1}\left(\frac{1}{X}\right)\right)}$$

$$\frac{\omega_{p5.3}}{\omega_o} = \frac{1}{\tan\left(\frac{1}{3}\tan^{-1}\left(\frac{1}{X}\right)\right)} \quad \frac{\omega_o}{\omega_z} = X$$

Figure 7:
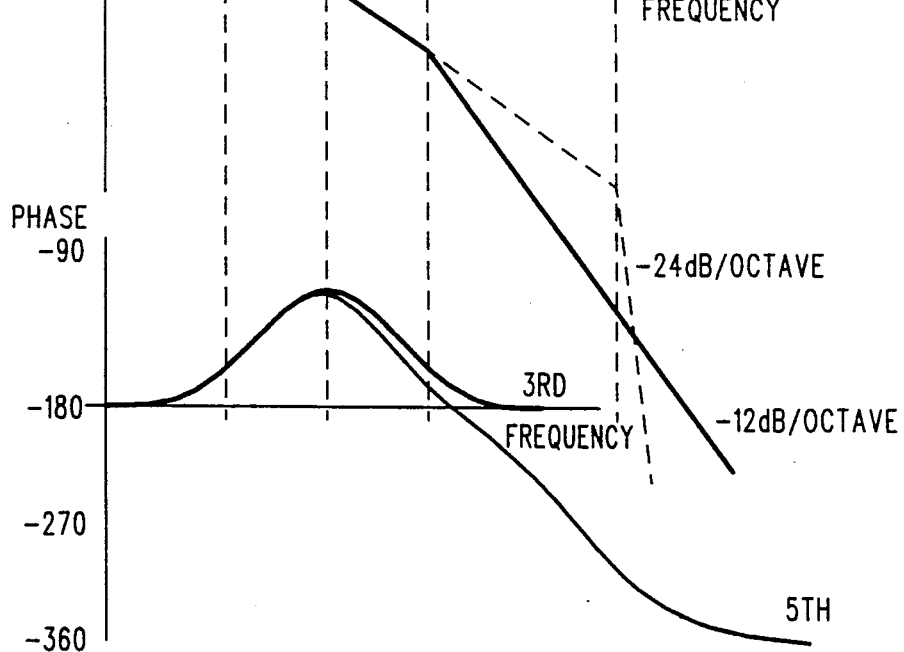
FIG. 7 is a gain versus frequency and a phase versus frequency graph of the loop response of the synthesizer of FIG. 6.

The gain and phase plots for the fifth order configuration are shown in FIG. 7. By holding the phase margin equal to a third order "optimum" PLL, the general expression for pole zero locations (before any pole skewing operations) is given below.

$$\frac{\omega_p N}{\omega_o} = \frac{1}{\tan\left(\frac{1}{(N-2)}\tan^{-1}\left(\frac{1}{X}\right)\right)} \quad \frac{\omega_o}{\omega_z} = X$$

where N is the order of the PLL.

In the preferred fifth order loop embodiment, the third order symmetric ratio of X is designed from the range of 2.0 to 2.5 (optimally 2.3 as opposed to the conventional value of 2.7) yielding a pole frequency to open loop unity gain frequency ratio in the range from 6.42 to 7.84, and the designed-for gain is in the range of $K_\phi/1.5$ to $K_\phi/3.0$, as shown in FIG. 5, to accommodate environmental and component variations previously not addressed.

What is claimed is:

1. A phase locked loop synthesizer having an open loop unity gain frequency and tolerance to component parameter variation, comprising:
    means for generating an output signal;
    means for producing a first signal related to a difference between said output signal and a predetermined reference signal; and
    means for modifying said first signal to produce a second signal coupled to said means for generating, said means for modifying including:
        (a) at least one filter transmission pole having a first break frequency related to the unity gain frequency by a first magnitude,
        (b) at least one filter transmission zero having a second break frequency related to the unity gain frequency by a second magnitude, and
        (c) a numeric value of one of said first magnitude and said second magnitude of 2.5 or less.

2. A phase locked loop in accordance with claim 1 wherein said first break frequency is equal to said unity gain frequency multiplied by said first magnitude.

3. A phase locked loop in accordance with claim 1 wherein said second break frequency is equal to said unity gain frequency divided by said second magnitude.

4. A phase locked loop in accordance with claim 1 wherein said numeric value is in the range of values from 2.5 to 2.0.

5. A phase locked loop in accordance with claim 1 wherein said means for modifying further comprises(d) a numeric value of said other one of said first magnitude and said second magnitude of 2.5 or less.

6. A phase locked loop in accordance with claim 1 wherein said means for modifying further includes a fifth order filter.

7. A phase locked loop in accordance with claim 6 wherein said means for modifying further comprises(d) a numeric value of said other one of said first magnitude and said second magnitude of 7.84 or less.

8. A phase locked loop in accordance with claim 1 further comprising at least one current source having a current output value related to a predetermined value by a factor of 1.5.

9. A phase locked loop synthesizer having an open loop unity gain frequency and tolerance to component parameter variation, comprising:
- a voltage controlled oscillator producing an output signal;
- a frequency divider coupled to the output signal of the voltage controlled oscillator and producing a frequency-divided output signal;
- a phase detector coupled to the frequency divider and producing a control signal representing a difference between said frequency-divided output signal and a predetermined reference signal;
- a loop filter coupled to said phase detector to modify said control signal and coupling said modified control signal to said voltage controlled oscillator and further including:
  (a) at least one filter transmission pole having a first break frequency,
  (b) at least one filter transmission zero having a second break frequency, and
  (c) a first relationship between said first break frequency and the open loop unity gain frequency being equal to a first numeric value and a second relationship between said second break frequency and the open loop unity gain frequency being equal to a second numeric value of 2.5 or less.

10. A phase locked loop in accordance with claim 9 wherein said first break frequency is equal to said unity gain frequency multiplied by said first relationship.

11. A phase locked loop in accordance with claim 9 wherein said second break frequency is equal to said unity gain frequency divided by said second relationship.

12. A phase locked loop in accordance with claim 9 wherein said numeric value is in the range of values from 2.5 to 2.0.

13. A phase locked loop in accordance with claim 9 wherein said first numeric value is 2.5 or less.

14. A phase locked loop in accordance with claim 9 wherein said loop filter further includes a fifth order filter.

15. A phase locked loop in accordance with claim 14 wherein said first numeric value is 7.84 or less.

16. A phase locked loop in accordance with claim 9 further comprising at least one current source having a current output value related to a predetermined value by a factor of 1.5.

* * * * *